(12) United States Patent
Ku et al.

(10) Patent No.: US 9,523,708 B2
(45) Date of Patent: Dec. 20, 2016

(54) ELECTRICAL TESTING DEVICE

(71) Applicant: MPI CORPORATION, Zhubei (TW)

(72) Inventors: Wei-Cheng Ku, Zhubei (TW); Shao-Wei Lu, Zhubei (TW); Ya-Hung Lo, Zhubei (TW); Shou-Jen Tsai, Zhubei (TW)

(73) Assignee: MPI Corporation, Zhubei (TW)

( * ) Notice: Subject to any disclaimer, the term of this patent is extended or adjusted under 35 U.S.C. 154(b) by 207 days.

(21) Appl. No.: 14/556,612

(22) Filed: Dec. 1, 2014

(65) Prior Publication Data

US 2015/0204907 A1    Jul. 23, 2015

(30) Foreign Application Priority Data

Dec. 13, 2013  (TW) .............................. 102146119 A

(51) Int. Cl.
| | |
|---|---|
| *G01R 31/00* | (2006.01) |
| *G01R 1/04* | (2006.01) |
| *G01R 31/28* | (2006.01) |
| *G01R 1/073* | (2006.01) |

(52) U.S. Cl.
CPC .............. *G01R 1/04* (2013.01); *G01R 31/2887* (2013.01); *G01R 1/07392* (2013.01)

(58) Field of Classification Search
CPC ............ G01R 1/06716; G01R 1/06733; G01R 1/06788; G01R 1/07314; G01R 3/00; G01R 31/2808; G01R 31/2889; G01R 31/312

See application file for complete search history.

(56) References Cited

U.S. PATENT DOCUMENTS

| | | | | |
|---|---|---|---|---|
| 5,404,111 A | * | 4/1995 | Mori .................. | G01R 1/07314 324/750.23 |
| 2002/0041189 A1 | * | 4/2002 | Okubo ............... | G01R 1/07357 324/756.03 |

* cited by examiner

*Primary Examiner* — Tung X Nguyen
(74) *Attorney, Agent, or Firm* — Lynette Wylie; Apex Juris, pllc.

(57) ABSTRACT

An electrical testing device includes a base having two parallel first rails, a platform provided on the base, a support provided between the first rails, a test arm, a rotary table provided on the test arm, a plurality of holders provided on the rotary table, and a plurality of probe sets respectively provided on the holders. The support has a second rail provided thereon, and is moveable relative to the base and the platform. The test arm is provided on the second rail and above the platform, wherein the test arm is moveable along with the support, and is also movable relative to the support. The rotary table is moveable or rotatable relative to the test arm. The holders are moveable along with the rotary table, and are also moveable or rotatable relative to the rotary table. The probe sets are moveable along with the holders.

8 Claims, 3 Drawing Sheets

ELECTRICAL TESTING DEVICE

BACKGROUND OF THE INVENTION

1. Technical Field

The present invention relates generally to electrical testing, and more particularly to an electrical testing device.

2. Description of Related Art

For a manufacturer of electronic products, a testing system capable of checking electrical connections between each precision electronic component is usually required in different steps of the manufacturing process, which helps to ensure the quality of products.

However, a conventional electrical testing device can only test products with one single testing specification at once, and has no capacity to handle tasks of multiple testing specifications. In addition, to test products with different specifications, it has to manually disassemble and replace corresponding probe sets, which is time-consuming and laborious.

BRIEF SUMMARY OF THE INVENTION

In view of the above, the primary objective of the present invention is to provide an electrical testing device, which is able to do electrical testing on objects with different specifications.

The present invention provides an electrical testing device, which is used to do an electrical testing on a tested portion of a DUT. The electrical testing device includes a base, a platform, a support, at least one test arm, at least one rotary table, a plurality of holders, and a plurality of probe sets. The base has two parallel first rails thereon. The platform is provided on the base for the DUT to be placed thereon. The support is provided on the first rails with a second rail provided thereon, and is movable relative to the base and the platform along the first rails. The test arm is provided on the second rail and above the platform, wherein the test arm is movable along with the support, and is also movable relative to the support along the second rail. The rotary table is provided on the test arm, and is moveable or rotatable relative to the test arm. The holders are provided on the rotary table, wherein the holders are moveable along with the rotary table, and are also moveable or rotatable relative to the rotary table. The probe sets are respectively provided on the holders, wherein the probe sets are moveable along with the holders, and contact with the tested portion of the DUT to do the electrical testing.

Whereby, with the aforementioned design, the electrical testing device can be used in testing tasks for different specifications.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
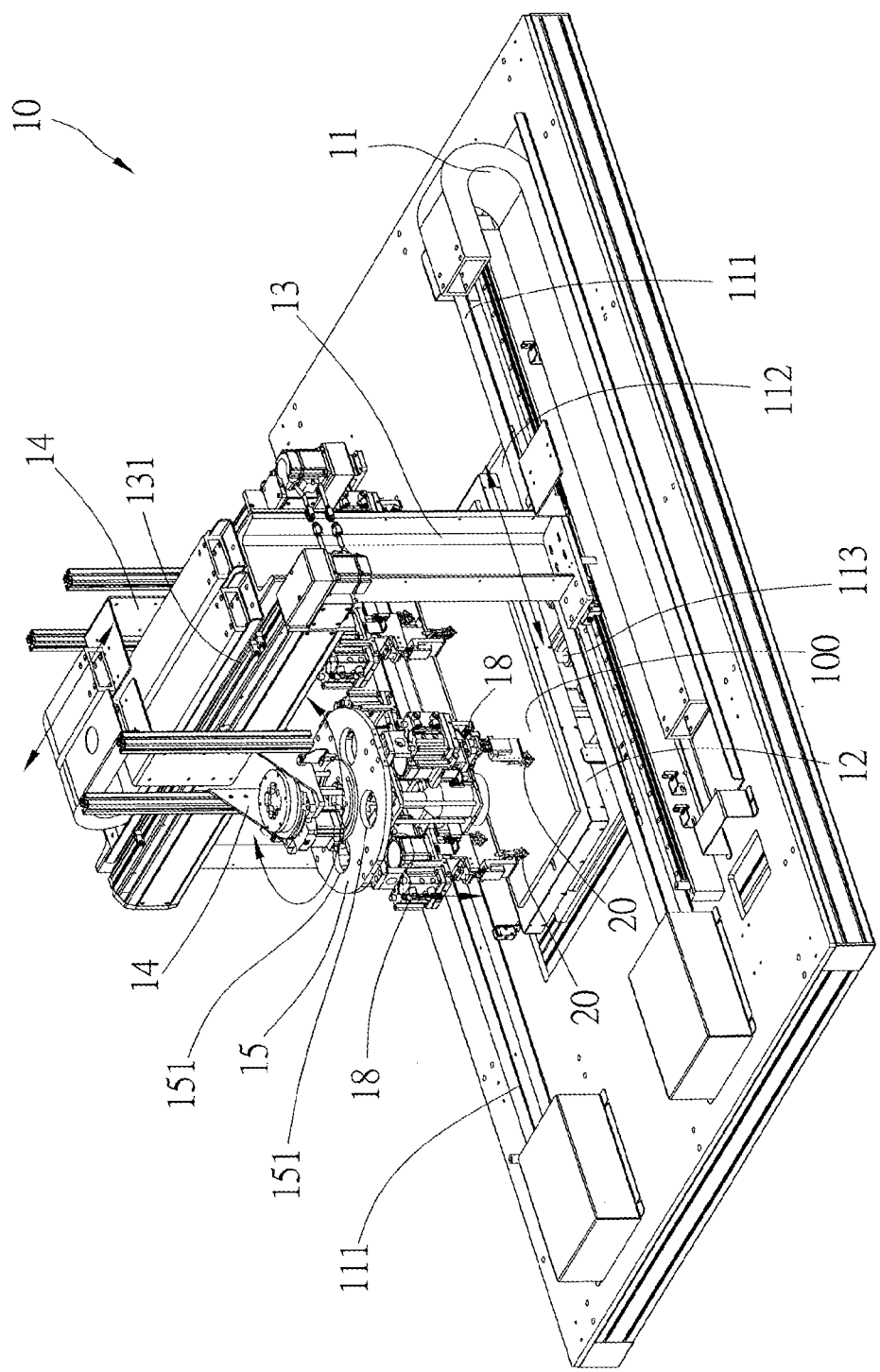
FIG. 1 is a perspective view of the electrical testing device of a preferred embodiment of the present invention.

As shown in FIG. 1, an electrical testing device 10 of the preferred embodiment of the present invention is used to do electrical testing on a DUT 100, which has a plurality of tested portions with different measuring distances (not shown) thereon. The electrical testing device includes a base 11, a platform 12, a support 13, two test arms 14, two rotary tables 15, four detectors 16, two tested members 17, a plurality of holders 18, and a plurality of probe sets 20.

The base 11 has two parallel first rails 111 thereon, and an opening 112 is located at the middle, or approximately the middle, between the first rails 111, wherein the opening 112 has a lifter 113 therein.

The DUT 100 can be placed on the platform 12, which is provided on the lifter 113 of the base 11, and can be hoisted and lowered in the opening 112 by the lifter 113.

The support 13 has two vertical sections connected together with a horizontal section, and therefore is in an approximate "n" shape. The vertical sections are respectively provided on the first rails 111, whereby the support 13 can be driven along the first rails 111 to be moved relative to the base 11 and the platform 12. In addition, a second rail 131 is provided on the horizontal section of the support 13, wherein a moving direction provided by the second rail 131 is perpendicular to that provided by the first rails 111.

The test arms 14 are provided on the second rail 131, and are respectively located at two opposite sides of the support 13 and above the platform 12. The test arms 14 can be moved together with the support 13, and can be also moved relative to the support 13 along the second rail 111.

Figure 2:
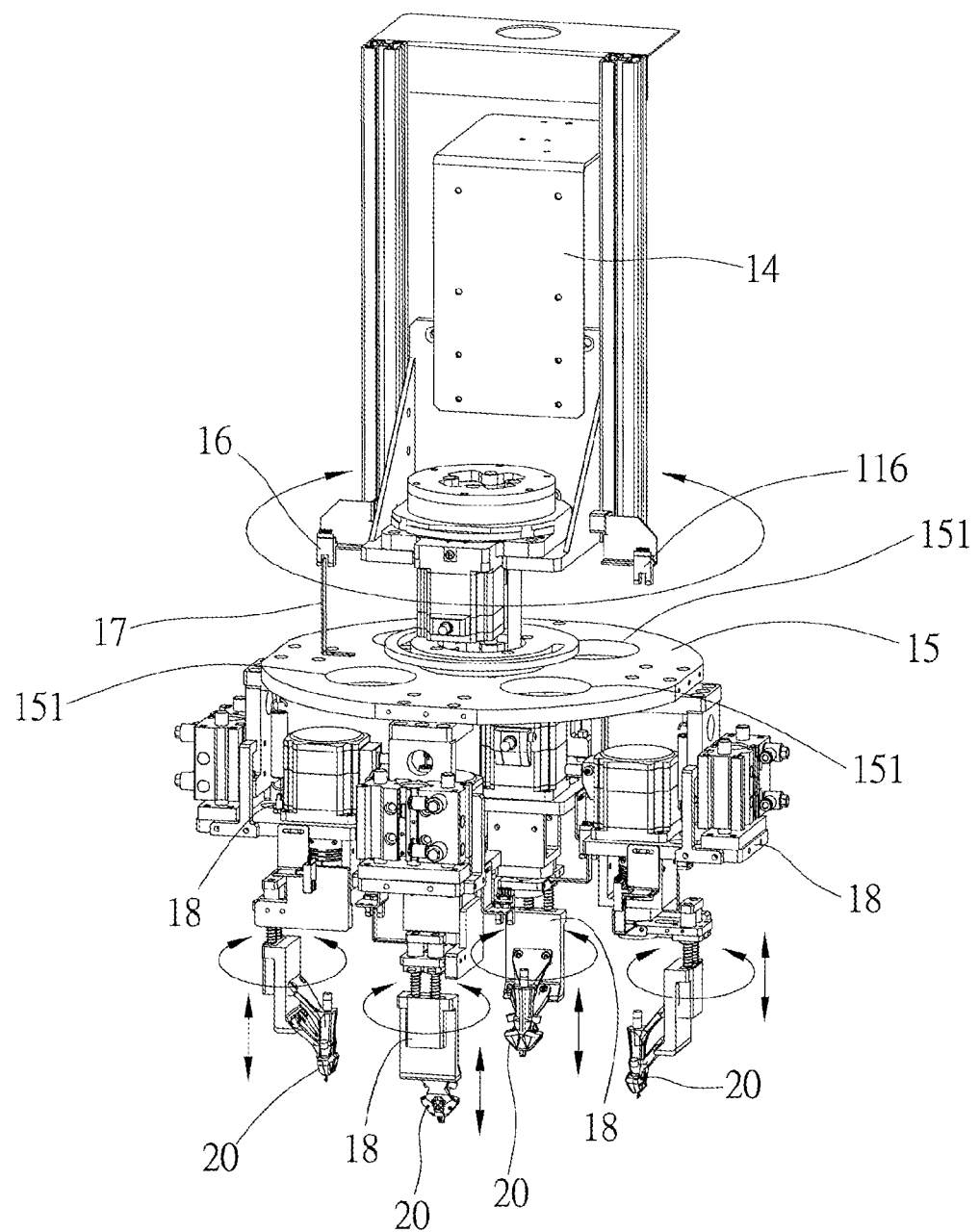
FIG. 2 is a perspective view of the preferred embodiment of the present invention, showing the structure of the test arm.

As shown in FIG. 2, each of the rotary tables 15 is round, and is respectively provided on one of the test arms 14, wherein the rotary tables 15 can be respectively driven to rotate or move relative to the corresponding test arm 14. For the purpose of weight reduction and convenience of connecting wires, a plurality of round holes 151 are evenly provided on each of the rotary tables 15.

The detectors 16 are respectively located at two opposite sides of the test arms 14. In other words, each of the test arms has two of the detectors 16 at two sides thereof. In the preferred embodiment of the present invention, the detectors 16 are photo interrupters which can detect whether light is interrupted in a detected zone thereof.

Each of the tested members 17 is respectively provided on one of the rotary tables 15. Take one of the rotary tables 15 for explanation, with its rotation, the tested member 17 provided thereon can be moved between the detected zones of the detectors 16 provided on the corresponding test arm 14. In the preferred embodiment of the present invention, each of the tested members 17 is a metal strip which extends upwardly into the detected zones of the corresponding detectors 16, but no higher than the detectors 16 themselves. Otherwise, when the rotary tables 15 rotate to move the tested member 17 provided thereon, it might collide with the detectors 16. Since each of the tested members 17 reaches the detected zones of the corresponding detectors 16, light in the detected zones can be interrupted. With the aforementioned design, if any detector 16 detects light is interrupted, the corresponding rotary table is rotated either for more than 180 degrees or in a wrong direction. In this way, the maximum rotation angle of the rotary tables 15 can be limited within 180 degrees in both directions, which prevents wires connected there from being twisted.

Every four holders 18 form a group, wherein these groups evenly surround the rotary tables 15. Each of the holders 18 can be moved along with the rotary tables 15 which it is provided thereon. In addition, each of the holders 18 can be driven to move or rotate relative to the corresponding rotary table 15 too.

Figure 3:
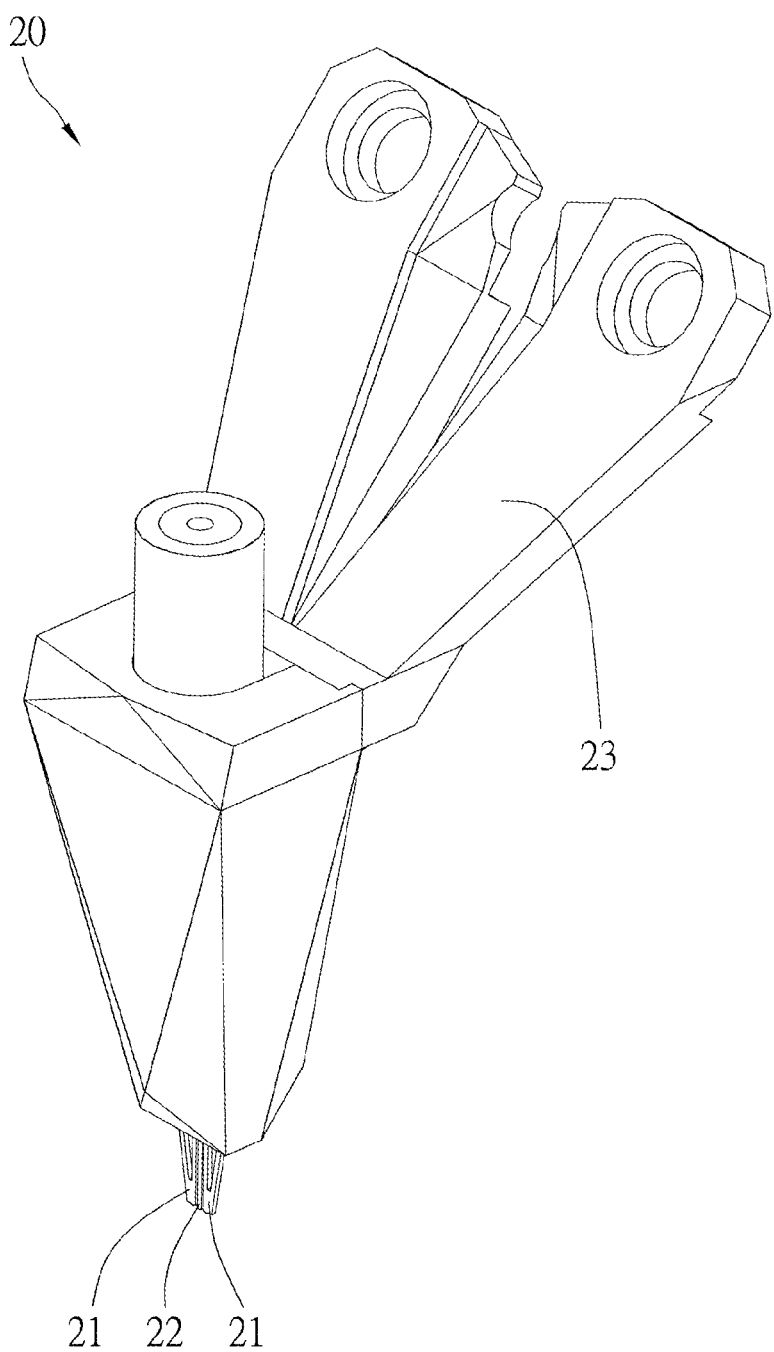
FIG. 3 is a perspective view of the probe set of the preferred embodiment of the present invention.

The probe sets 20 are respectively fixed on the holders 18 to be moved along with the holders 18. As shown in FIG. 3, each of the probe sets 20 has three probes 21, 22 and a case 23 to receive the probes 21, 22. The case 23 is connected to one of the holders 18, and tips of the probes 21, 22 are extended out of the case 23. In more details, the probes 21, 22 includes two ground probes 21 and a signal probe 22 which are defined according to the transmission direction of signals while testing, wherein the signal probe 22 is located between the ground probes 21. It is worth mentioning that, a distance between the signal probe 22 and each of the ground probes 21 for each of the probe sets 20 is different from each other, and therefore the electrical testing device 10 has wider compatibility than the conventional types.

Whereby, when a tester intends to do electrical testing, the support 13, the test arms 14, the rotary tables 15, and the holders 18 of the electrical testing device 10 can be moved or rotated according to the location and measuring distance of the tested portion which is going to be tested. After the probe set 20 corresponding to the measuring distance is moved on the tested portion, the corresponding holder 18 can be manipulated to move the probe set 20 downwardly, and finally to make the ground probes 21 and the signal probe 22 of the probe set 20 contact the tested portion of the DUT for doing the follow up electrical testing.

In summary, with the aforementioned design of multiple probe sets 20, the electrical testing device 10 has wider compatibility. Furthermore, the support 13, the test arms 14, the rotary tables 15, and the holders 18 can be moved or rotated to bring each of the probe sets 20 to different locations with different angles, and therefore no matter at what angle a tested portion is located, the electrical testing device 10 provided in the present invention can always do electrical testing thereon.

It must be pointed out that the embodiments described above are only some preferred embodiments of the present invention. All equivalent structures which employ the concepts disclosed in this specification and the appended claims should fall within the scope of the present invention.

What is claimed is:

1. A electrical testing device, which is used to do an electrical testing on a tested portion of a DUT, comprising:
   a base having two parallel first rails thereon;
   a platform provided on the base for the DUT to be placed thereon;
   a support provided on the first rails, wherein the support is movable relative to the base and the platform along the first rails, and has a second rail provided thereon;
   at least one test arm provided on the second rail and above the platform, wherein the test arm is movable along with the support, and is also movable relative to the support along the second rail;
   at least one rotary table provided on the test arm, wherein the rotary table is moveable or rotatable relative to the test arm;
   a plurality of holders provided on the rotary table, wherein the holders are moveable along with the rotary table, and are also moveable or rotatable relative to the rotary table; and
   a plurality of probe sets respectively provided on the holders, wherein the probe sets are moveable along with the holders, and contact with the tested portion of the DUT to do the electrical testing.

2. The electrical testing device of claim 1, wherein the base further has an opening located at the middle between the first rails; the platform is located at the opening.

3. The electrical testing device of claim 1, wherein the base further has a lifter provided in the opening; the platform is provided on the lifter, and can be hoisted and lowered in the opening by the lifter.

4. The electrical testing device of claim 1, further comprising two detectors and a tested member, wherein the detectors are respectively provided at two opposite sides of the test arm, while the tested member provided on the rotary table, and is moveable between the detectors along with rotation of the rotary table.

5. The electrical testing device of claim 1, wherein a moving direction provided by the first rails is perpendicular to a moving direction provided by the second rail.

6. The electrical testing device of claim 1, wherein the rotary table is round, and the holders evenly surround the rotary table.

7. The electrical testing device of claim 1, wherein the numbers of the at least one test arm and the at least one rotary table are both two; the test arms are respectively located at two opposite side of the support; the rotary tables are respectively connected to the test arms.

8. The electrical testing device of claim 1, wherein each of the probe sets has at least two probes; a distance between the probes of each of the probe sets is different from each other.

\* \* \* \* \*